United States Patent
Su et al.

(10) Patent No.: US 6,841,446 B2
(45) Date of Patent: Jan. 11, 2005

(54) FABRICATION METHOD FOR A FLASH MEMORY DEVICE

(75) Inventors: Chun-Lein Su, Shanhua Chen (TW); Tzung-Ting Han, I-Ian (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/338,999

(22) Filed: Jan. 8, 2003

(65) Prior Publication Data

US 2004/0203204 A1 Oct. 14, 2004

Related U.S. Application Data

(63) Continuation-in-part of application No. 10/058,682, filed on Jan. 28, 2002, now abandoned.

(30) Foreign Application Priority Data

Jan. 9, 2002 (TW) ........................... 91100171 A

(51) Int. Cl.[7] ............................................. H01L 21/336
(52) U.S. Cl. ........................................ 438/258; 438/200
(58) Field of Search ................................ 438/199–200, 438/257–267, 981

(56) References Cited

U.S. PATENT DOCUMENTS

| | | | | | |
|---|---|---|---|---|---|
| 5,635,416 | A | * | 6/1997 | Chen et al. ................ | 438/258 |
| 6,004,847 | A | * | 12/1999 | Clementi et al. ........... | 438/258 |
| 6,204,159 | B1 | * | 3/2001 | Chang et al. .............. | 438/594 |
| 6,429,073 | B1 | * | 8/2002 | Furuhata et al. ........... | 438/258 |

\* cited by examiner

*Primary Examiner*—David Nelms
*Assistant Examiner*—David Vu
(74) *Attorney, Agent, or Firm*—J.C. Patents

(57) ABSTRACT

In a fabrication method of a flash memory device, a first oxide layer is formed on the substrate in the memory cell region and in the peripheral circuit region. A first conductive layer is formed and defined to form a plurality of floating gates in the memory cell region. A second oxide layer and a silicon nitride layer are sequentially formed in the memory cell region and in the peripheral circuit region. The first conductive layer, the second oxide layer and the silicon nitride layer in the peripheral circuit region are removed. A doped region is formed in the peripheral circuit region. A third oxide layer is formed in the memory cell region and in the peripheral circuit region by wet rapid thermal oxidation. Thereafter, a second conductive layer is deposited to form concurrently a control gate in the memory cell region and a gate in the peripheral circuit region.

6 Claims, 6 Drawing Sheets

FABRICATION METHOD FOR A FLASH MEMORY DEVICE

CROSS-REFERENCE TO RELATED APPLICATION

This is a continuation-in-part application of the parent application Ser. No. 10/058,682, filed on Jan. 28, 2002 now abandoned.

BACKGROUND OF THE INVENTION

1. Field of Invention

The present invention relates to a fabrication method for a semiconductor device. More particularly, the present invention relates to a fabrication method for a flash memory device.

2. Description of Related Art

An electrically erasable programmable read-only memory ($E^2$PROM) is the memory device most often used in computers and electronic products because under the normal circumstances, the stored programs and information are retained and not erased. Erasure of the stored programs and information is achieved by subjecting the memory under an ultraviolet light for a period of time. The old programs and information are erased and new programs and information are stored. Moreover, the erasure of programs and information in an $E^2$PROM is bit by bit. The stored information in an $E^2$PROM is retained even when the power is interrupted. Additionally, the program function, the reading function and the erasure function can conduct for multiple times. Recently, a flash $E^2$PROM is developed, wherein the erasure of information is block by block. The erasure function is therefore very fast and is normally accomplished in 1 to 2 seconds, which is faster than the normal $E^2$PROM. The flash $E^2$PROM is more time efficient and the manufacturing cost is also lower.

The fabrication of a flash memory device is normally combined with the fabrication of the peripheral circuit to simply the manufacturing process and to reduce the processing time. FIGS. 1A through 1D are schematic, cross-sectional views, illustrating the successive steps of fabricating a flash memory device according to the prior art, which is a concurrent fabrication of a flash memory device and a peripheral circuit.

FIGS. 1A through 1D are schematic, cross-sectional views, illustrating the successive steps of fabricating a flash memory device according to the prior art.

As shown in FIG. 1A, a first oxide layer 106 is formed on a substrate 100, which is already divided into a memory cell region 102 and a peripheral circuit region 104. A first conductive layer 108 is formed on the first oxide layer 106 in both the memory cell region 102 and in the peripheral circuit region 104. The first conductive layer 108 in the memory cell region 102 is then defined to form a plurality of floating gates 108a. A silicon oxide 110-silicon nitride 112-silicon oxide 114 (ONO) layer 116 is further formed on the substrate 100 in both the memory cell region 102 and the peripheral circuit region 104.

Referring to FIG. 1B, the first conductive layer 108, the silicon oxide layers 110, 114 and the silicon nitride layer 112 in the peripheral circuit region 104 are removed to expose the first oxide layer 106. A photoresist layer 122 is then formed on the silicon oxide layer 114 in the memory cell region 102. Using the first oxide layer 106 in the peripheral circuit region 104 as a sacrificial oxide layer 106a, an ion implantation 118 is conducted on the substrate 100 to form a doped region 120 in the peripheral circuit region 104.

As shown in FIG. 1C, subsequent to the ion implantation 118, the sacrificial oxide layer 106a is removed. The photoresist layer 122 is also removed using oxygen ($O_2$) plasma and a sulfuric acid ($H_2SO_4$) aqueous solution. While the photoresist layer 122 is being removed, the polymer 124 debris on the surface of the floating gates 108a is exposed, reducing the reliability of the device. Moreover, the native oxide 126 on the substrate 100 surface in the peripheral circuit region 104 also adversely affects the quality of the subsequently formed gate oxide layer. In order to mitigate the aforementioned problems occurring in the prior art, a hydrofluoric acid aqueous solution is used to remove the polymer 124 debris on the floating gates 108a and the native oxide 126 on the substrate 100 surface. However, after resolving the polymer debris 124 and the native oxide 126 problems, other problem arises as illustrated in FIG. 1D.

Referring to FIG. 1D, subsequent to the removal of the polymer 124 debris and the native oxide 126 with the hydrofluoric acid solution, the top oxide layer 114 of the ONO gate dielectric layer 116 is eroded by the hydrofluoric acid solution. The original oxide layer 114 thereby becomes a thinner oxide layer 114a, leading to electrical problems.

SUMMARY OF THE INVENTION

The invention provides a fabrication method for a flash memory device, wherein the polymer debris is completely removed to further enhance the quality of the gate oxide layer while the top oxide layer of the ONO dielectric layer is prevented from being eroded and becoming thinner.

The present invention provides a fabrication method for a flash memory device, wherein a first oxide layer is formed on a substrate that is already divided into a memory cell region and a peripheral circuit region. A first conductive layer is then formed on the first oxide layer in the memory cell region and in the peripheral circuit region, wherein the first conductive layer in the memory cell region is defined to form a plurality of floating gates. A second oxide layer and a silicon nitride layer are sequentially formed on the substrate in the memory cell region and the peripheral circuit region. The first conductive layer, the second oxide layer and the silicon nitride layer in the peripheral circuit region are removed, exposing the first oxide layer. A photoresist layer is further formed on the silicon nitride layer in the memory cell region. Using the first oxide layer in the peripheral circuit region as a sacrificial oxide layer, an ion implantation is conducted on the substrate in the peripheral circuit region to form a doped region in the peripheral circuit region. Thereafter the sacrificial layer is removed. The photoresist layer is also removed using $O_2$ plasma and a sulfuric acid aqueous solution. Removing the sacrificial layer and the photoresist layer, however, would lead to a formation of polymer debris and native oxide. The polymer debris and the native oxide are then removed by a hydrofluoric acid aqueous solution. Thereafter, a wet rapid thermal oxidation (wet RTO) is performed to form a third oxide layer in the memory cell region and in the peripheral circuit region. The third oxide layer that covers the memory cell region is a gate dielectric layer and the third oxide layer that covers the peripheral circuit region is a gate oxide layer. A second conductive layer is subsequently formed on the substrate and defined to form concurrently a control gate in the memory cell region and a gate in the peripheral circuit region.

According to the present invention, only the oxide layer and the overlying silicon nitride layer are formed when forming the stacked dielectric layer. The polymer debris and the native oxide can be removed while the common problem of having the top layer of the stacked dielectric layer being eroded and becoming thinner when the top layer of the stacked dielectric layer is an oxide layer as in the prior art is prevented. Additionally, a wet RTO is performed to concurrently form the top oxide layer of the stacked dielectric layer and the gate oxide layer in the peripheral circuit region. The top oxide layer and the gate oxide layer are formed by reaction of oxygen radicals with the silicon nitride in the memory cell region and the substrate in the peripheral circuit region. As a result, the top oxide layer and the gate oxide layer are formed with a better quality, the processing time is reduced and the processing procedure is simplified. Moreover, a thermal oxidation may be additionally conducted to further increase the thickness of the gate oxide layer if the initial thickness of the gate oxide layer is not sufficient. Since underlying the top oxide layer of the stacked dielectric layer is a silicon nitride layer, the thermal oxidation process does not affect the thickness of the top oxide layer of the stacked dielectric layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A through 2F are schematic, cross-sectional views, illustrating the successive steps in fabricating a flash memory device according to a preferred embodiment of the present invention.

Figure 1A:
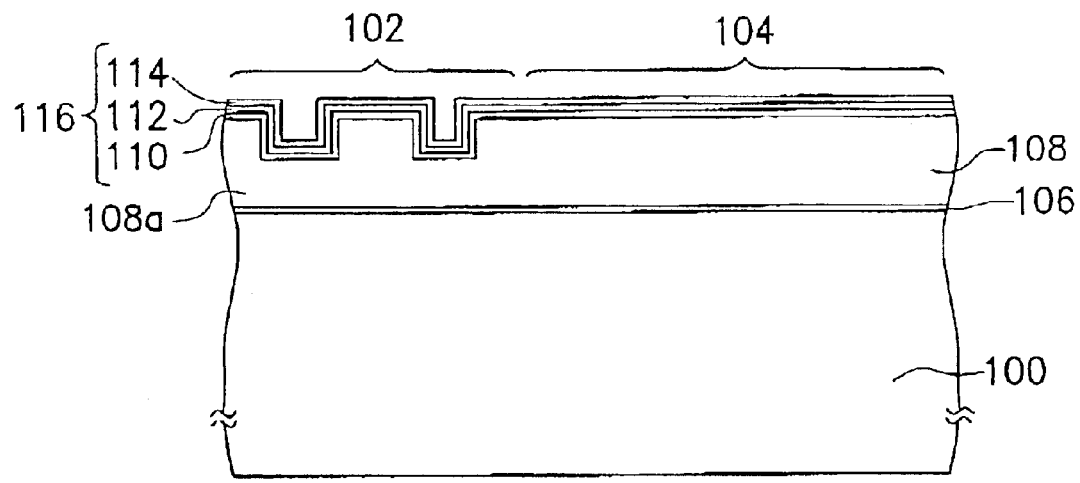
FIGS. 1A through 1D are schematic, cross-sectional views, illustrating the successive steps in fabricating a conventional flash memory device.
Figure 1B:
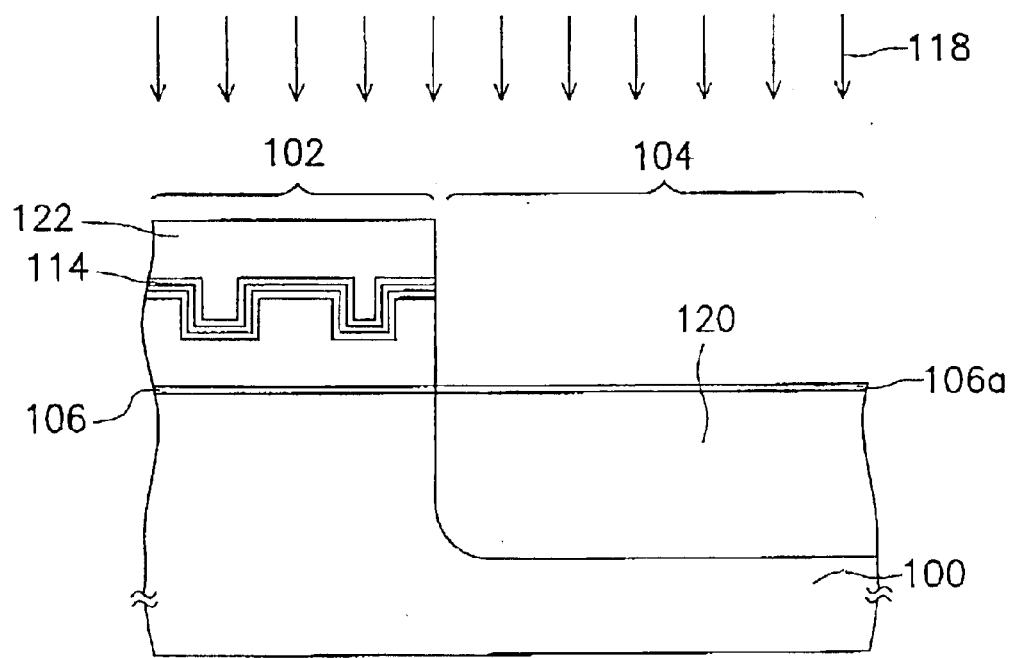
Figure 1C:
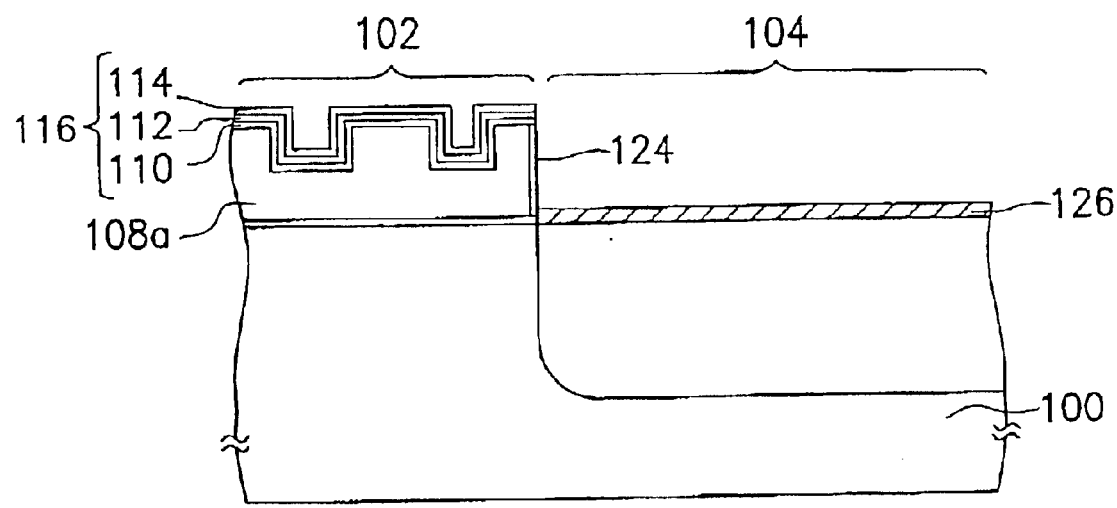
Figure 1D:
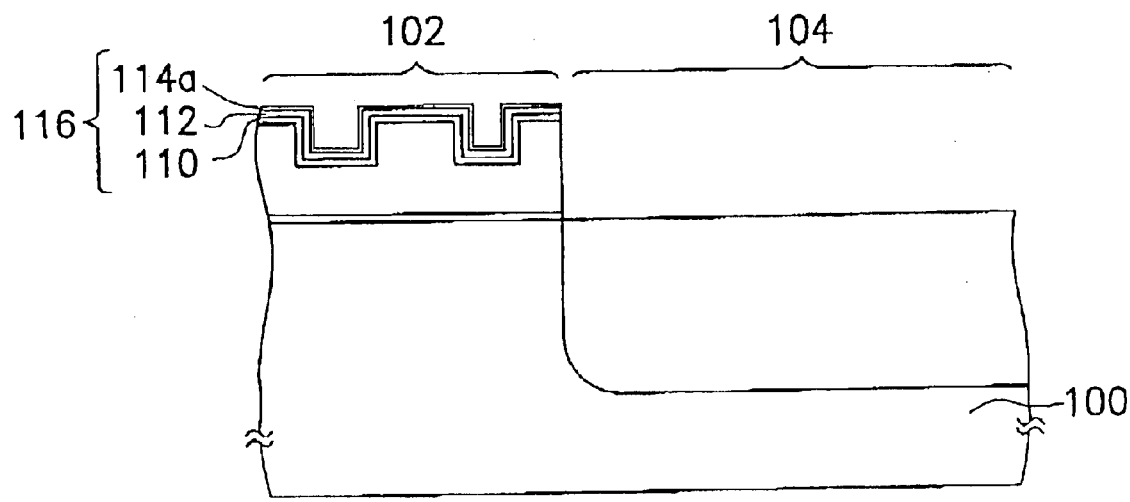
Figure 2A:
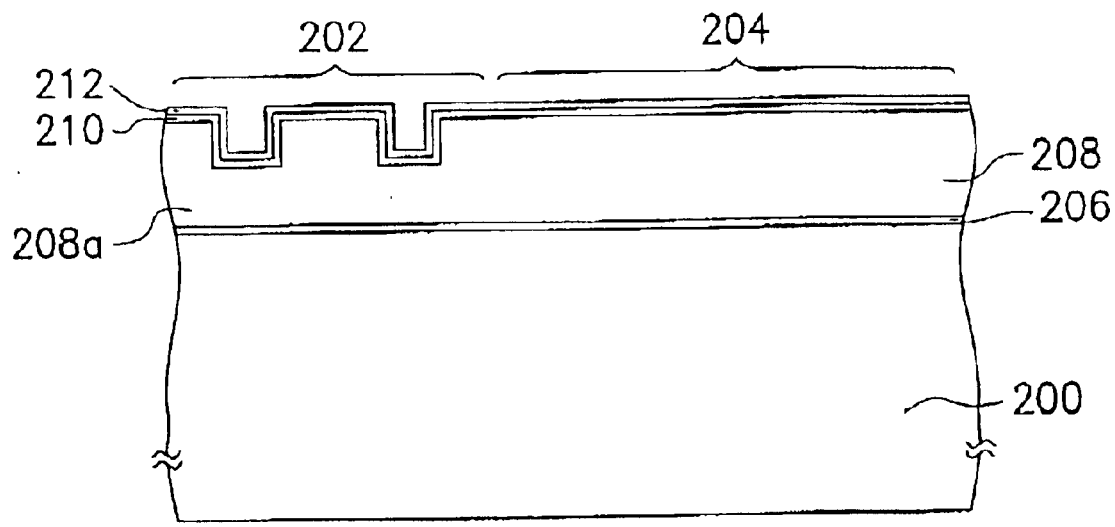
FIGS. 2A through 2F are schematic, cross-sectional views, illustrating the successive steps in fabricating a flash memory device according to a preferred embodiment of the present invention.

As shown in FIG. 2A, an oxide layer 206 is formed on a substrate 200, wherein the substrate is already divided into a memory cell region 202 and a peripheral circuit region 204. A conductive layer 208 is formed on the oxide layer 206 in both the memory cell region 202 and the peripheral circuit region 204. The conductive layer 208 in the memory cell region 202 is then defined to form a plurality of floating gates 208a in the memory cell region 202. An oxide layer 210 and a silicon nitride layer 212 are sequentially formed on the substrate 200 in both the memory cell region 202 and the peripheral circuit region 204.

Figure 2B:
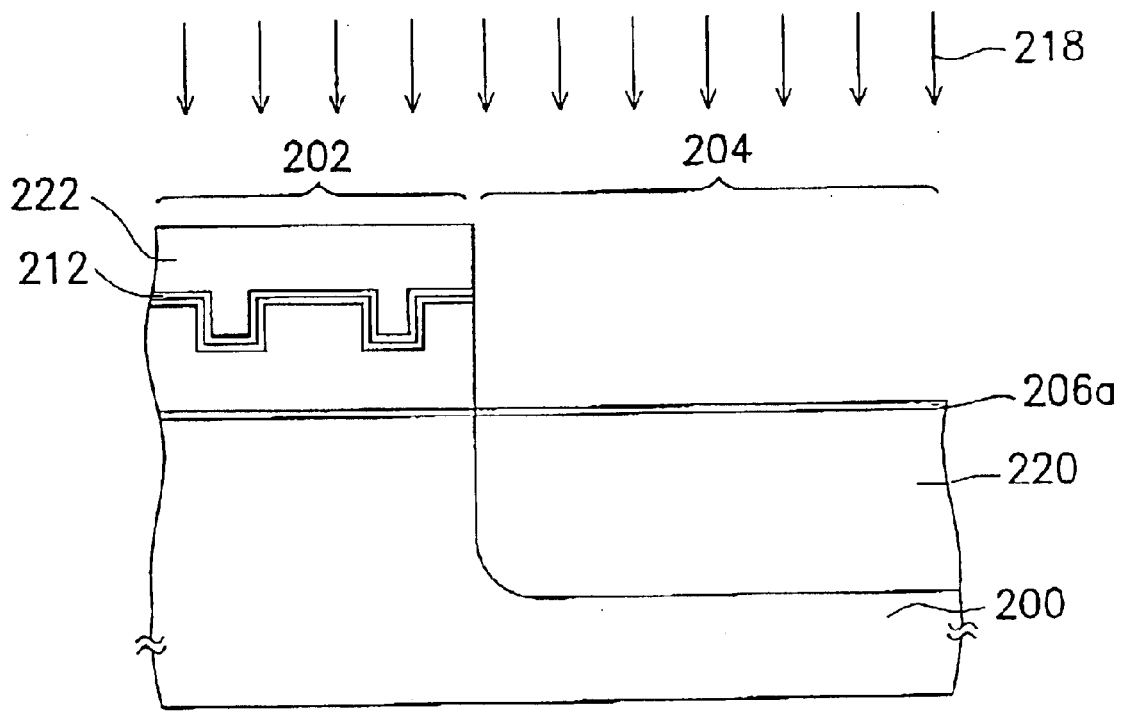

Referring to FIG. 2B, the conductive layer 208, the oxide layer 210 and the silicon nitride layer 212 in the peripheral circuit region 204 are removed, exposing the oxide layer 206. A photoresist layer 222 is then formed on the silicon nitride layer 212 in the memory cell region 202. Using the oxide layer 206 in the peripheral circuit region 204 as a sacrificial oxide layer 206a, an ion implantation process 218 is conducted to form a doped region 220 in the peripheral circuit region 204, wherein the doped region 220 is, for example, a well region.

Figure 2C:
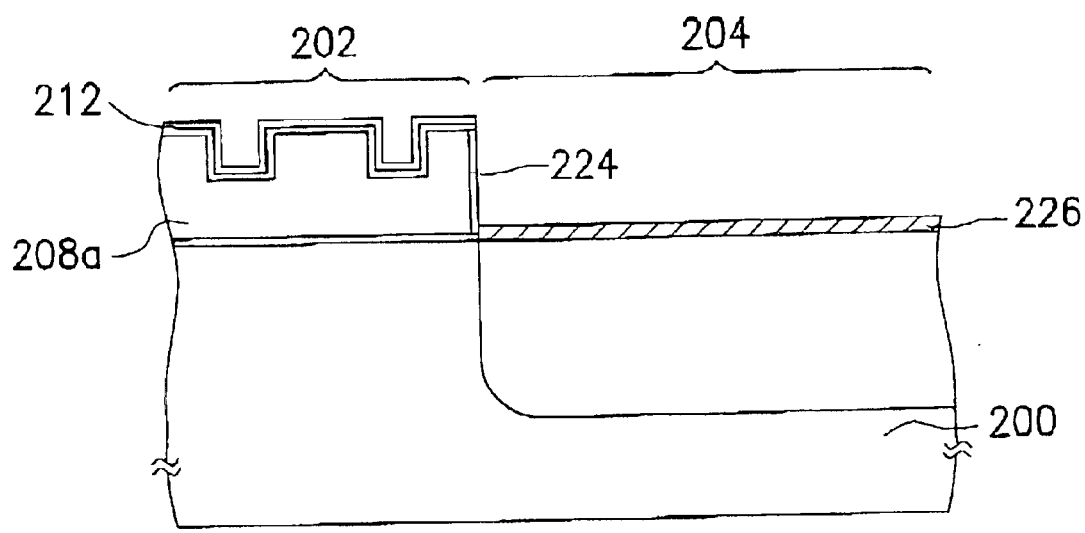

Continue to FIG. 2C, the sacrificial oxide layer 206a is removed after the ion implantation process 218 followed by removing the photoresist layer 222. The photoresist layer is removed, for example, by $O_2$ plasma and a sulfuric acid aqueous solution. During the removal of the photoresist layer 222, the polymer 224 debris on the surface of the floating gate 208a is exposed. Moreover, the native oxide 226 on the substrate 200 surface is also exposed. The polymer 224 debris on the surface of the floating gates 208a reduces the reliability of the device. The native oxide 226 on the surface of the substrate 200 in the peripheral region 204 also lowers the quality of the subsequently formed gate oxide layer. A hydrofluoric acid aqueous solution is thus used to remove the polymer 224 debris on the floating gates 208a and the native oxide 226 on the substrate 200 in the peripheral circuit region 204.

Figure 2D:
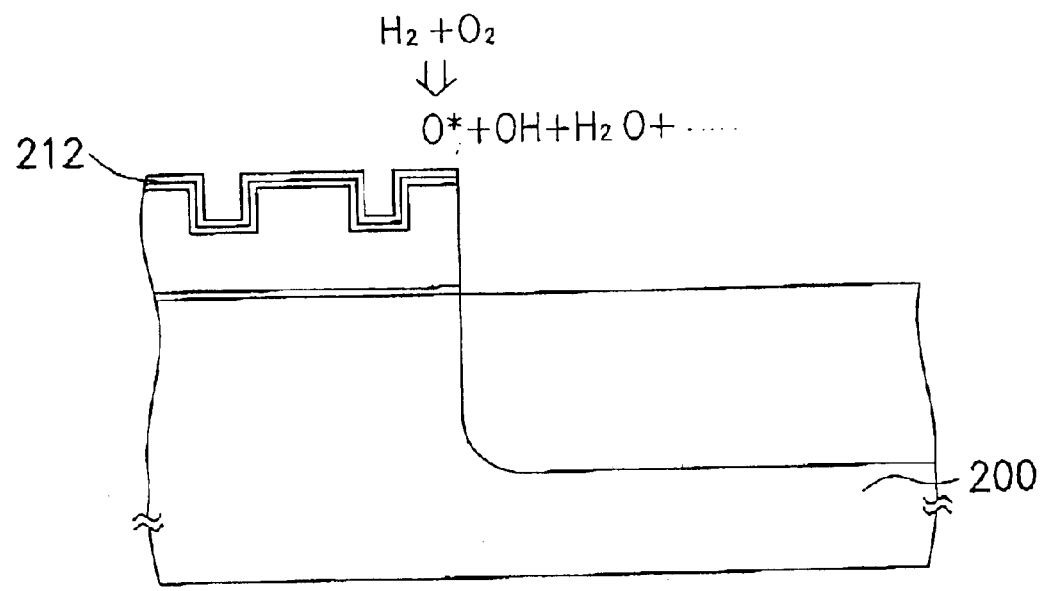

As shown in FIG. 2D, the substrate 200 surface cleaning process is conducted using a hydrofluoric acid aqueous solution to remove the polymer 224 debris and the native oxide 226. Since the top layer of the gate dielectric layer is the silicon nitride layer 212, the thinning of the top layer of the gate dielectric layer is prevented when the surface cleaning process is conducted. The problem of having the top layer of the gate dielectric layer becomes thinner as often occurred in the prior art because the conventional top layer of the gate dielectric layer is an oxide layer when the surface cleaning process is conducted is thereby avoided.

Figure 2E:
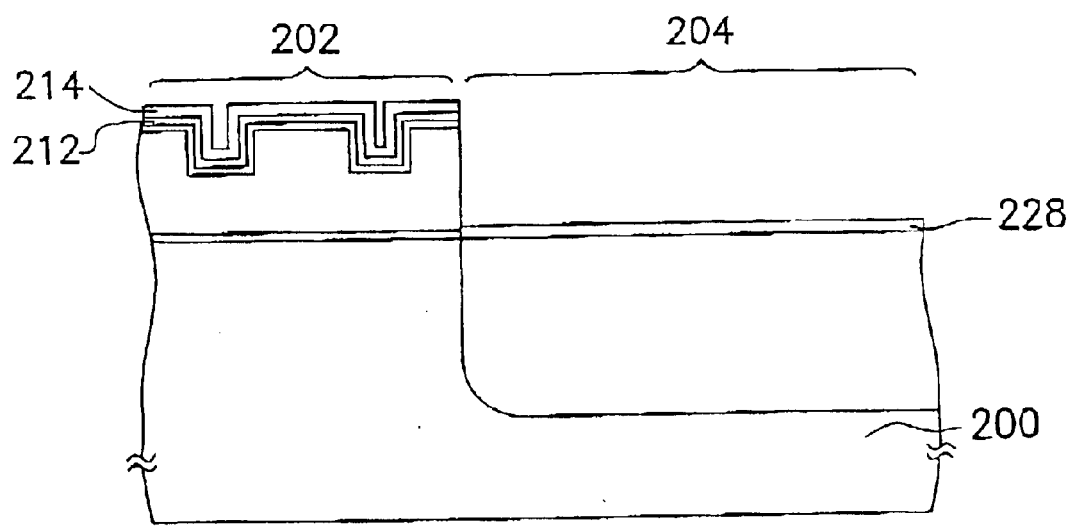

Referring to FIG. 2E, a wet rapid thermal oxidation (wet RTO) preferably is performed to form an oxide layer in the memory cell region 202 and the peripheral circuit region 204, wherein the oxide layer that covers the memory cell region serves as a top oxide layer 214 of the gate dielectric layer 216 and the oxide layer that covers the peripheral circuit region 204 serves as a gate oxide layer 228.

According to a preferred embodiment of the invention, the wet RTO is performed according to the following mechanism:

$$H_2 + O_2 \rightarrow 2OH \quad (1)$$

$$H_2 + OH \rightarrow H_2O + H \quad (2)$$

$$O_2 + H \rightarrow OH + O^* \quad (3)$$

Figure 3:
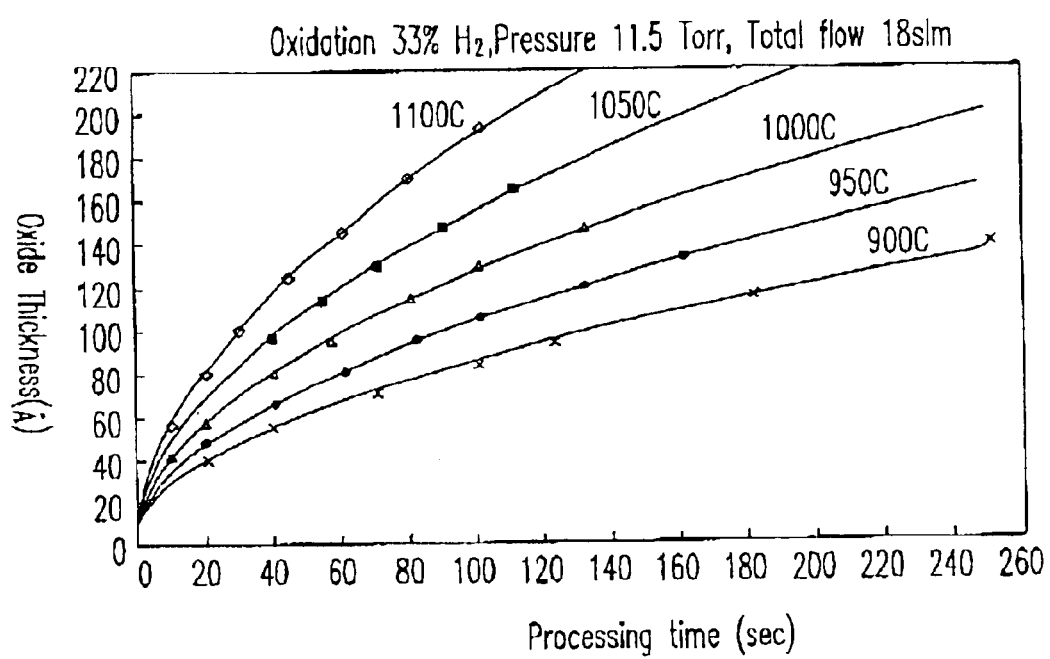
FIG. 3 is a graph illustrating the variation of the oxide thickness obtained by a wet rapid thermal oxidation performed according to an embodiment of the invention.

In this wet RTO, pre-mixed $H_2$ and $O_2$ are introduced in the low pressure chamber directly without combustion. A rapid thermal process then is performed to provide the energy for the chain reactions (1)–(3) and generate the oxygen radical $O^*$. This activated oxygen radical reacts with the silicon nitride of the layer 212 and the substrate silicon in the peripheral circuit region 204 to form the silicon oxide of the top oxide layer 214 and the gate oxide layer 228. The above wet RTO is particularly advantageous in that a partial oxidation of the silicon nitride is effectively accomplished, and a high-quality top oxide layer is obtained. Furthermore, no additional annealing process is needed. In an embodiment, the oxidation rate of silicon nitride (in the memory cell region) to silicon substrate (in the peripheral circuit region) is about 0.6 to 1. Therefore, about 100 Å of gate oxide layer 228 are typically formed in the peripheral circuit region 204 after about 60 Å of top oxide layer 214 are formed in the memory cell region 202. The graph of FIG. 3 illustrates the result of an example of wet RTO performed under different temperatures, with a reaction pressure of 11.5 torrs and a total flow of 18 slm.

Usually, it is difficult to effectively form an oxide on a nitride material by wet oxidation because nitride usually exhibits a water-resistant characteristic. However, by using the wet RTO of the invention with pre-mixed H2 and O2 for generating oxygen radicals, oxide is effectively formed on the nitride layer. The active radicals will react with the silicon nitride 212, thereby forming the desired oxide on the nitride. Thus, the present invention employs the wet oxidation involving a rapid thermal process to form the oxide on the nitride layer.

Since the gate oxide layer 228 and the top oxide layer 214 of the gate dielectric layer 216 are concurrently formed, the processing time is greatly reduced and the processing procedure is simplified. Furthermore, if the gate oxide layer 228 is not thick enough, thermal oxidation is further conducted to increase the thickness of the gate oxide layer 228. Additionally, underneath the top oxide layer 214 of the gate dielectric layer 216 is a silicon nitride layer, the thickness of the top oxide layer 214 of the gate dielectric layer 216 is not affected by the thermal oxidation process.

Figure 2F:
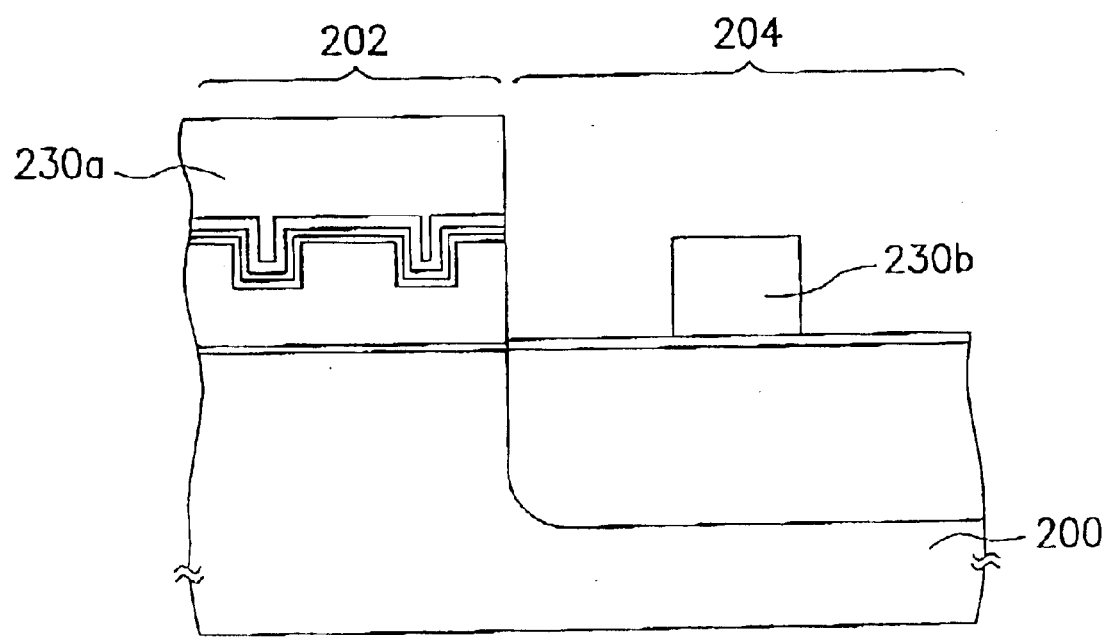

Referring to FIG. 2F, a conductive layer is formed on the substrate 200. The conductive layer is further defined to concurrently form a control gate 230a on the memory cell region 202 and a gate 230b on the peripheral circuit region 204.

One aspect of the present invention is to form the oxide layer and its overlying silicon nitride layer first when forming the stacked dielectric layer. Another silicon oxide layer is then formed on the silicon nitride layer subsequent to the ion implantation process performed on the peripheral circuit region. Since the silicon nitride layer has a high tolerance to the cleaning solution used in cleaning the photoresist debris and the native oxide, a cleaning process using a hyrdorfluoric acid cleaning solution is conducted to remove, for example, the photoresist debris and the native oxide subsequent to the removal of the photoresist layer by the $O_2$ plasma and the sulfuric acid aqueous solution. As a result, the photoresist debris and the native oxide are completely removed, while the problems of getting the top layer of the dielectric layer eroded by the cleaning solution and becoming thinner is prevented.

Another aspect of the present invention is the gate oxide layer in peripheral circuit region is concurrently formed while the top oxide layer of the stacked dielectric layer is formed in the memory cell region by wet RTO. Therefore, high-quality silicon oxide is formed in both memory cell region and peripheral circuit region. The processing time is thus reduced and the processing procedure is simplified.

Furthermore, another aspect of the present invention is when a greater difference in thickness is desired between top oxide layer of the stacked dielectric layer and the gate oxide layer, a thermal oxidation process is conducted to increase the thickness of the gate oxide layer. The thickness of the top oxide layer of the stacked dielectric layer is not affected by the thermal oxidation process because underneath the top oxide layer of the stacked dielectric layer is a silicon nitride layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a flash memory device, comprising:

providing a substrate, wherein the substrate is divided into a memory cell region and a peripheral circuit region;

forming a first oxide layer on the substrate in the memory cell region and in the peripheral circuit region;

forming a first conductive layer on the first oxide layer in the memory cell region and in the peripheral circuit region;

defining the first conductive layer to form a plurality of floating gates in the memory cell region;

forming sequentially a second oxide layer and a silicon nitride layer on the substrate in the memory cell region and in the peripheral circuit region;

removing the first conductive layer, the second oxide layer and the silicon nitride layer in the peripheral circuit region to expose the first oxide layer;

forming a photoresist layer on the silicon nitride layer in the memory cell region;

performing an ion implantation process on the substrate to form a doped region in the peripheral circuit region using the first oxide layer as a sacrificial oxide layer;

removing the sacrificial oxide layer;

removing the photoresist layer;

forming a third oxide layer on the substrate in the memory cell region and in the peripheral circuit region, wherein the third oxide layer is formed by performing a wet rapid thermal oxidation (wet RTO) having pre-mixed $H_2$ and $O_2$ for generating oxygen radicals that react with the silicon nitride layer in the memory cell region and the substrate in the peripheral circuit region to form the third oxide layer;

forming a second conductive layer on the substrate; and defining the second conductive layer to form concurrently a control gate in the memory cell region and a gate in the peripheral circuit region.

2. The method of claim 1, wherein subsequent to the formation of the third oxide layer, a thermal oxidation process is conducted to increase a thickness of the gate oxide layer.

3. The method of claim 1, wherein the doped region formed by the ion implantation process includes a well region.

4. The method of claim 1, wherein the photoresist layer is removed by using an oxygen plasma and a sulfuric acid solution.

5. The method of claim 1, wherein subsequent to the removal of the photoresist layer further includes performing a cleaning process using hydrofluoric acid.

6. The method of claim 1, wherein an oxidation rate of the silicon nitride in the memory cell region to the substrate in the peripheral circuit region is about 0.6 to 1 in the wet RTO.

* * * * *